(12) United States Patent
Dix et al.

(10) Patent No.: US 8,937,351 B2
(45) Date of Patent: Jan. 20, 2015

(54) POWER MOS TRANSISTOR WITH IMPROVED METAL CONTACT

(71) Applicant: Microchip Technology Incorporated, Chandler, AZ (US)

(72) Inventors: Gregory Dix, Tempe, AZ (US); Harold Kline, Phoenix, AZ (US); Dan Grimm, Mesa, AZ (US); Roger Melcher, Gilbert, AZ (US); Jacob L. Williams, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/784,723

(22) Filed: Mar. 4, 2013

(65) Prior Publication Data

US 2014/0246722 A1 Sep. 4, 2014

(51) Int. Cl.
  *H01L 29/66* (2006.01)
  *H01L 29/78* (2006.01)
  *H01L 23/522* (2006.01)

(52) U.S. Cl.
  CPC .......... *H01L 29/78* (2013.01); *H01L 29/66477* (2013.01); *H01L 23/5226* (2013.01)
  USPC ........... 257/341; 257/203; 257/211; 257/368; 257/401; 257/773; 257/774; 257/E27.03; 257/E29.255

(58) Field of Classification Search
  CPC ............ H01L 21/76816; H01L 23/528; H01L 21/76877
  USPC ......... 257/203, 211, 341, 368, 401, 773, 774, 257/E27.06, E29.255
  See application file for complete search history.

(56) References Cited

U.S. PATENT DOCUMENTS

| | | | |
|---|---|---|---|
| 6,369,446 B1 | 4/2002 | Tanaka | 257/758 |
| 7,076,070 B2 * | 7/2006 | Pearce et al. | 381/120 |
| 7,956,384 B2 * | 6/2011 | Mallikararjunaswamy | 257/203 |
| 2011/0024907 A1 | 2/2011 | Fujiyama | 257/751 |
| 2011/0109287 A1 | 5/2011 | Nakamura et al. | 323/282 |

OTHER PUBLICATIONS

International Search Report and Written Opinion, Application No. PCT/US2014/018034, 16 pages, Aug. 12, 2014.

* cited by examiner

*Primary Examiner* — Meiya Li
*Assistant Examiner* — Peter M Albrecht
(74) *Attorney, Agent, or Firm* — King & Spalding L.L.P.

(57) ABSTRACT

A power metal-oxide-semiconductor (MOS) field effect transistor (FET) has a plurality of transistor cells, each cell having a source region and a drain region to be contacted through a surface of a silicon wafer die, A first dielectric layer is disposed on the surface of the silicon wafer die and a plurality of grooves are formed in the first dielectric layer above the source regions and drain regions, respectively and filled with a conductive material, A second dielectric layer is disposed on a surface of the first dielectric layer and has openings to expose contact areas to the grooves. A metal layer is disposed on a surface of the second dielectric layer and filling the openings, wherein the metal layer is patterned and etched to form separate metal wires connecting each drain region and each source region of the plurality of transistor cells, respectively through the grooves.

18 Claims, 6 Drawing Sheets

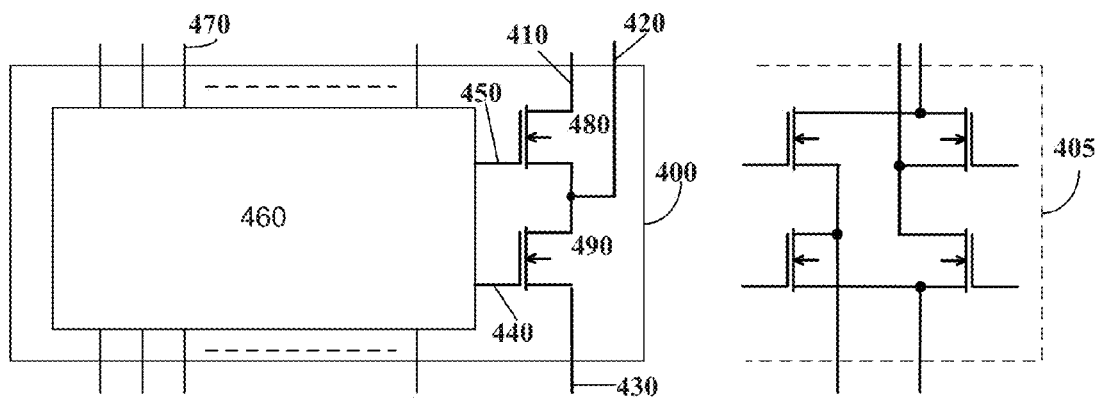
*Figure 4A*  *Figure 4B*
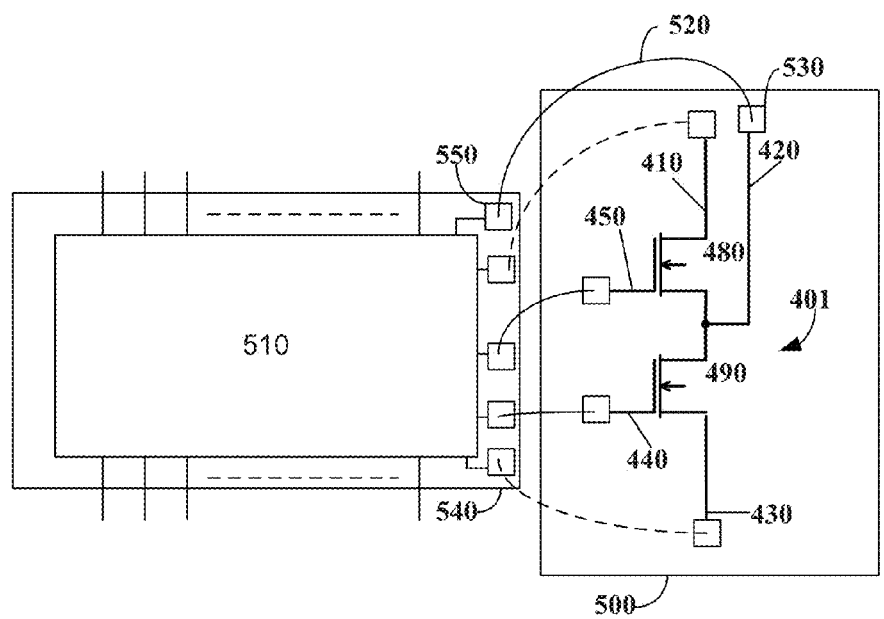
*Figure 5*

POWER MOS TRANSISTOR WITH IMPROVED METAL CONTACT

TECHNICAL FIELD

This application concerns a power metal-oxide-semiconductor Field Effect Transistor (MOSFET) with an improved metal contact and a method for manufacturing such a FET.

BACKGROUND

Semiconductor devices comprising power field effect transistors use metal wires to interconnect the respective elements such as source and drain, in particular if the power MOSFET consists of a plurality of transistor cells that are coupled in parallel on the semiconductor die to form a single power MOSFET. Such a metal layer cannot be deposited directly on a surface of a semiconductor die as it would contaminate the underlying semiconductor layers and possibly render the device inoperable. In conventional devices, the metal wires consist for example of aluminum. However, other materials such as copper may be used. Generally, films of aluminum are deposited first over a dielectric layer covering the top of the semiconductor wafer, patterned, and then etched, leaving isolated wires 610 as shown in FIGS. 6-8. These wires 610 contact the respective active areas (drain, source, gates) through holes, called vias 630, that have been previously etched in the insulating material wherein tungsten is deposited in the vias for example by means of a chemical vapor deposition CVD technique. Another layer of dielectric material is then deposited over the exposed wires. The first metal layer with its various wires 610 is then interconnected by a second metal layer 620 by means of further vias 640 etched in the top insulating material. This method can be continued to create an even distribution of the metal wire resistance, and increasing metal wire widths allowing for a large enough metal wire size to be connected to a lead frame for assembly into a final packaged part. Generally at least three metal layers are used for interconnecting in a semiconductor device comprising power MOSFETs. Additionally manufacturing tolerances of metal wire processing may limit how close the source and drain areas can be and still be electrically connected. However, other devices use even more layers. This results in respective necessary additional process steps which therefore are a significant cost contributor and reduce silicon area efficiency when manufacturing power MOSFETs.

SUMMARY

Hence, a need exists for an improved integrated circuit device and process for manufacturing, in particular an integrated circuit device comprising a power MOSFET.

According to an embodiment, a power MOS field effect transistor (FET) may comprise a plurality of transistor cells, each cell comprising a source region and a drain region to be contacted through a surface of a silicon wafer die; a first dielectric layer disposed on the surface of the silicon wafer die; a plurality of grooves in said first dielectric layer formed above the source regions and drain regions, respectively and filled with a conductive material; a second dielectric layer disposed on a surface of the first dielectric layer and comprising openings to expose contact areas to said grooves; and a metal layer disposed on a surface of said second dielectric layer and filling said openings, wherein the metal layer is patterned and etched to form separate metal wires connecting each drain region and each source region of the plurality of transistor cells, respectively through said grooves.

According to a further embodiment, the drain and source regions can be strip shaped. According to a further embodiment, the grooves may cover a substantial surface area of the drain and source regions, respectively. According to a further embodiment, each groove can be associated with one opening in the dielectric layer. According to a further embodiment, the openings in the second dielectric layer can be approximately square or round. According to a further embodiment, the openings in the second dielectric layer can be rectangular. According to further embodiments, an additional or no additional metal layer may be disposed on top of the metal layer.

According to another embodiment, a device may comprise a housing comprising a microcontroller and at least one power MOS field effect transistor (FET), wherein the MOSFET comprises a plurality of transistor cells, each cell comprising a source region and a drain region to be contacted through a surface of a silicon wafer die; a first dielectric layer disposed on the surface of the silicon wafer die; a plurality of grooves in said first dielectric layer formed above the source regions and drain regions, respectively and filled with a conductive material; a second dielectric layer disposed on a surface of the first dielectric layer and comprising openings to expose contact areas to said grooves; and a metal layer disposed on a surface of said second dielectric layer and filling said openings, wherein the metal layer is patterned and etched to form separate metal wires connecting each drain region and each source region of the plurality of transistor cells, respectively through said grooves.

According to a further embodiment of the above device, the microcontroller can be formed on a first chip and the at least one power transistor is formed on a second chip, wherein the first and second chip are connected within said housing by wire bonding. According to a further embodiment of the above device, the microcontroller and the at least one power transistor may be formed on a single chip. According to a further embodiment of the above device, the device may comprise a plurality of power MOSFETs.

According to another embodiment, a method for manufacturing a power MOS field effect transistor (FET), may comprise: forming a power MOSFET within a semiconductor wafer die comprising a plurality of transistor cells, each cell comprising a drain and a source region; disposing a first dielectric layer on the surface of the semiconductor wafer die; patterning and etching the first dielectric layer to form a plurality of grooves in said first dielectric layer above the source regions and drain regions, respectively, filling the grooves with a conductive material, disposing a second dielectric layer on a surface of the first dielectric layer and forming openings in the second dielectric layer to expose contact areas to said grooves; and disposing a metal layer on a surface of said second dielectric layer, and patterning and etching the metal layer to form separate metal wires connecting each drain region and each source region of the plurality of transistor cells, respectively through said grooves.

According to a further embodiment of the above method, the drain and source regions can be strip shaped. According to a further embodiment of the above method, the grooves may cover a substantial surface area of the drain and source regions, respectively. According to a further embodiment of the above method, each groove may be associated with one opening in the dielectric layer. According to a further embodiment of the above method, the openings in the second dielectric layer can be approximately square or round. According to a further embodiment of the above method, the openings in said second dielectric layer can be rectangular. According to further embodiments of the above method, an additional or no additional metal layer is disposed on top of the metal layer.

BRIEF DESCRIPTION OF THE DRAWINGS

A more complete understanding of the present disclosure may be acquired by referring to the following description taken in conjunction with the accompanying drawings wherein:

FIGS. 4A and 4B show further embodiments using a power MOSFET in an integrated circuit device;

FIG. 5 shows a further embodiments using a combination of a power MOSFET die and an integrated circuit device that can be placed in a single housing;

Figure 1:
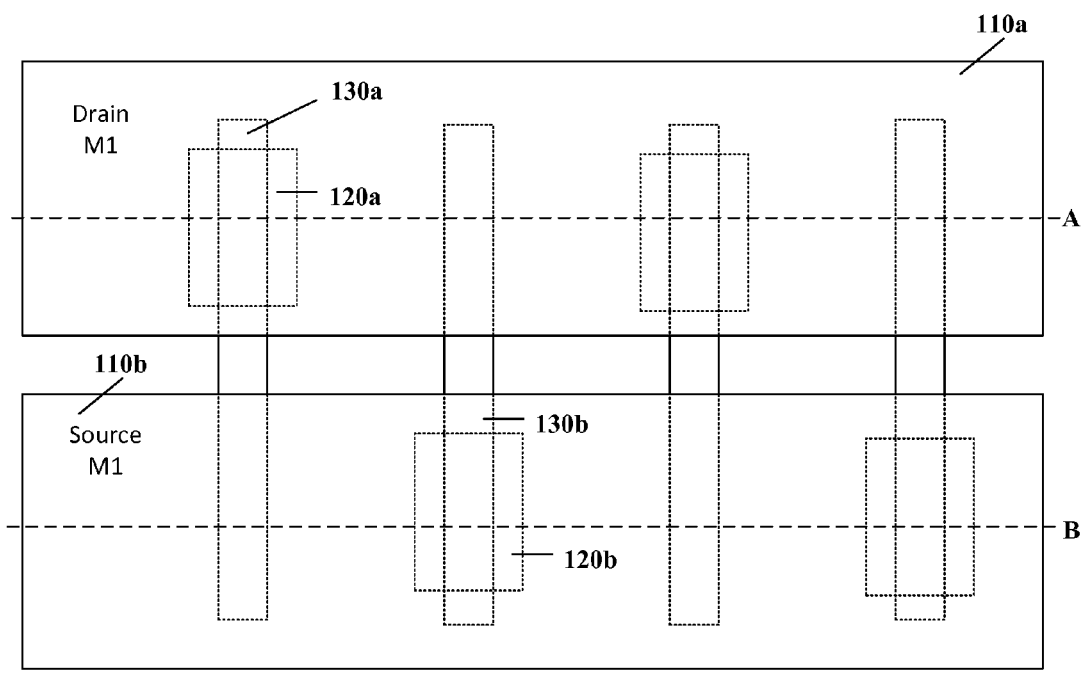
FIG. 1 is a top view of an embodiment of a power MOSFET.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

According to various embodiments, a method for forming a grooved contact vs. cingulated contacts such as vias is proposed. This approach allows to form a good interconnection of active regions and metal layer and avoid the necessity of an additional metal layer.

The contact groove can be masked with an oxide layer according to various embodiments and selectively allows metal to make electrical connection to a portion of the contact. Thus, the need for an extra layer of metal, and therefore the via processing steps can be eliminated. This results in cost reduction for the production of power MOSFETs, tighter pitch of contacts, and enables a front side only contacted FET semiconductor device.

FIG. 1 shows a top view of a semiconductor power MOSFET. FIG. 1 shows the interconnection of active drain and source regions by means of contact grooves 130a and 130b formed within a dielectric layer deposited on the surface top of semiconductor wafer. The grooves 130a and 130b are formed above the respective active source and drain areas. Similar contact grooves can be used for gate connections. However, FIGS. 1-3 only show the connections to the drain and source regions.

Figure 2:
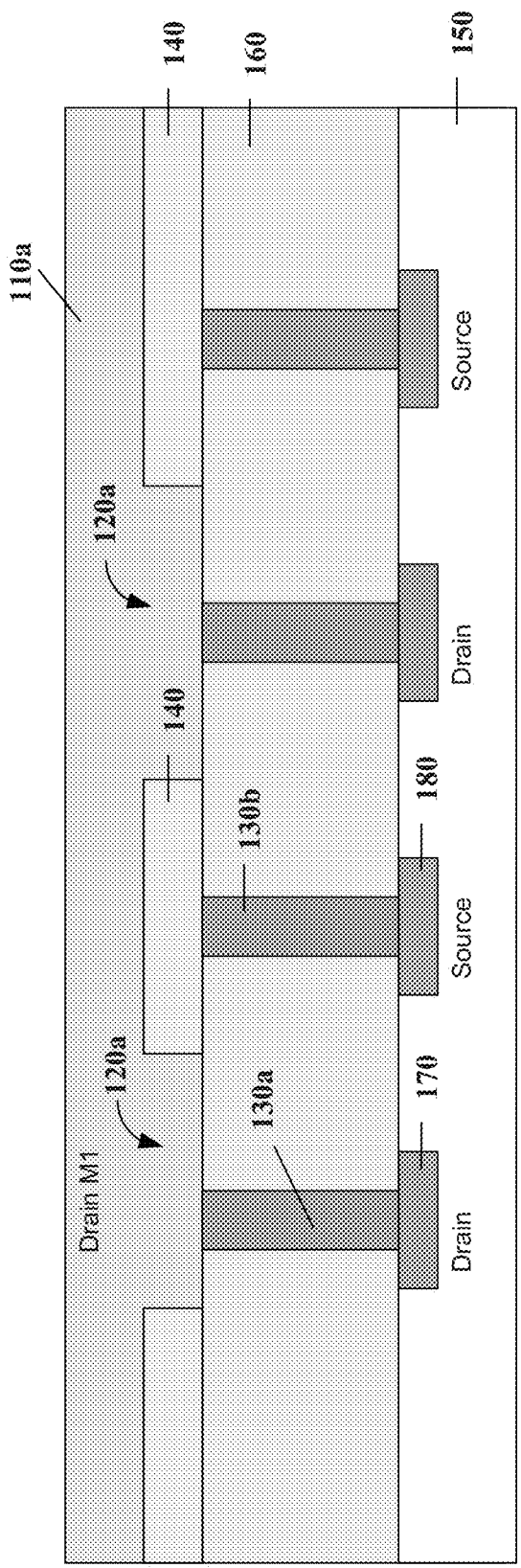
FIG. 2 is a sectional view along the line A of FIG. 1.
Figure 3:
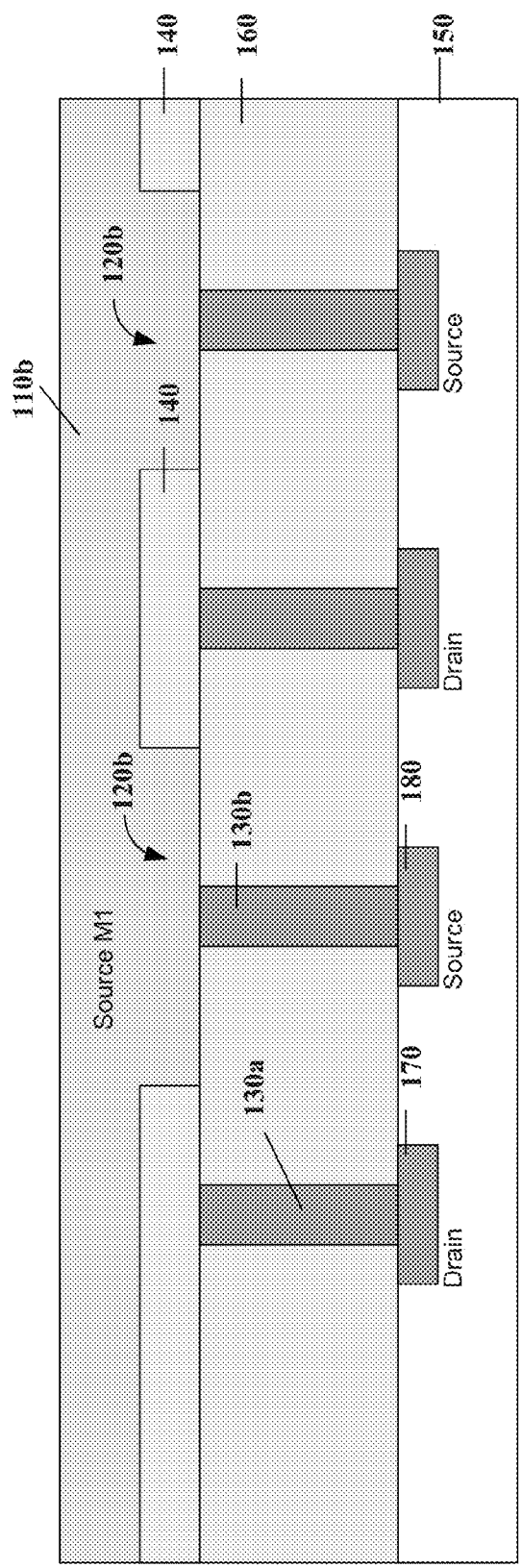
FIG. 3 is a sectional view along the line B of FIG. 1.
Figure 6:
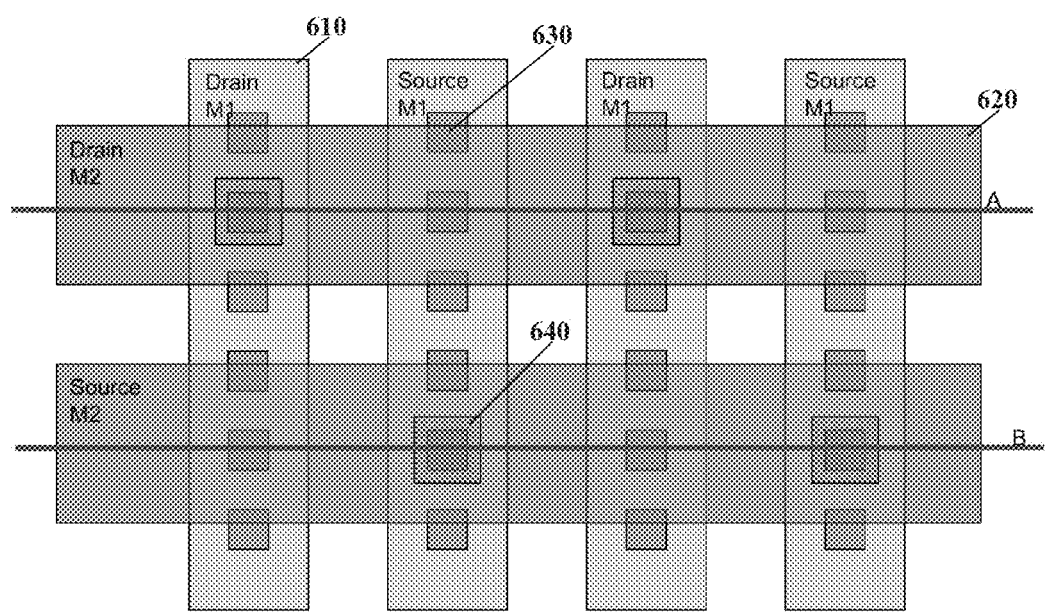
FIGS. 6-8 show top and sectional views of a conventional device.
Figure 7:
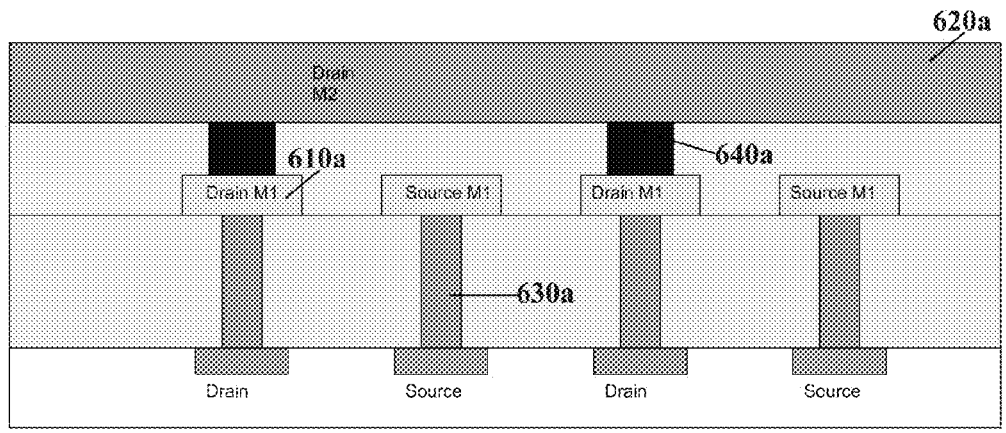
Figure 8:
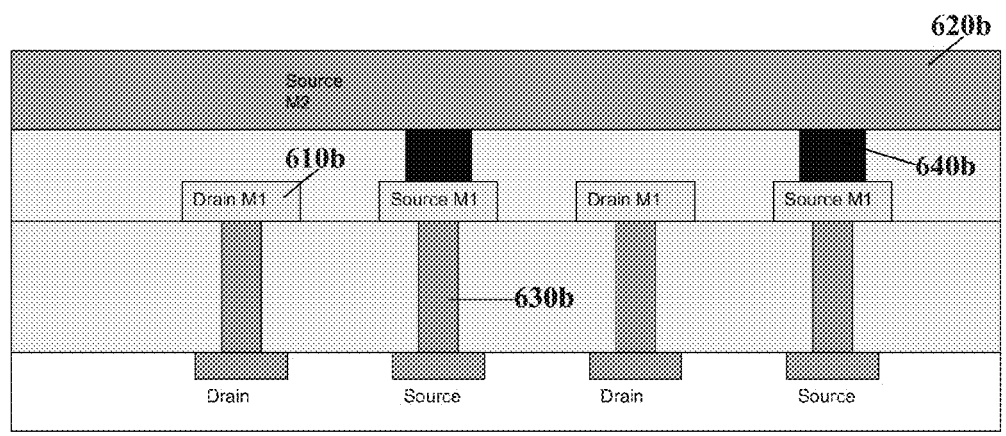

As shown in more detail in FIGS. 2 and 3, a semiconductor die comprises an epitaxial layer 150 with active source and drain regions 170, 180, respectively. These regions 170 and 180 are generally arranged in an alternating pattern to create a plurality of transistor cells each having a source, drain and a respective gate (not shown). The source and drain regions 170, 180 may be shaped in various forms. As shown in FIG. 1 according to an embodiment, these regions are shaped as elongated strips. However, other shapes may apply. To create a power MOSFET device a plurality of these cells need to be interconnected in parallel. Thus, all drain regions are connected to each other and all source regions are connected to each other. To this end, a dielectric layer 160 is deposited on the top surface. Then this dielectric layer 160 is patterned and etched to provide for grooves 130a and 130b that are positioned above the respective drain and source regions 170 and 180, respectively as shown in FIGS. 2 and 3. The etched grooves 130a, 130b are then filled with a conducting material, such as tungsten.

According to various embodiments, a second dielectric layer 140 is deposited on this structure. This second dielectric layer 140 is then also patterned and etched to form specific contact openings 120a and 120b. Finally, a metal layer is directly deposited on the structure to provide for the respective interconnection of drain and source regions 170, 180. To this end, the top metal layer 110a, b may be further patterned and etched to form single insulated wire lines 110a, 110b as shown in the top view of FIG. 1.

According to various embodiments as mentioned above, the drain and source regions can be strip shaped as shown in FIG. 1. The grooves may cover a substantial surface area of the underlying drain and source regions, respectively. Each groove may be associated with one opening in the dielectric layer as shown in FIG. 1. However, according to other embodiments, more than one contact opening may be provided in the second dielectric insulating layer. The openings in the second dielectric layer can be rectangular as shown in FIG. 1. However, according to other embodiments, the openings in the second dielectric layer can also be approximately square or round. Additional layers of metal and corresponding via openings can be added to enable metal wire widths suitable for assembly of the part. The openings 120a, b can be made large enough to allow the metal to directly contact the tungsten of groove 130a, b thus eliminating the need for a separate via filling step while maintaining a substantially tight spacing of the tungsten layer. Metal wires 110a, b can be aluminum or copper. Typically insulating layers 140, and 160 will be any type of dielectric oxide layer.

FIG. 4A shows schematically how a microcontroller 460 can be combined with two power transistors 480 and 490 according to an embodiment as described above on a single chip 400. Microcontroller 460 may have a plurality of peripheral devices such as controllable drivers, modulators, in particular pulse width modulators, timers etc. and is capable to drive the gates 440 and 450 of transistors 480 and 490 directly or through respective additional drivers. The chip 400 can be configured to make a plurality of functions of the microcontroller available through external connections or pins 470. The source of first transistor 480 can be connected to external connection or pin 410. Similarly, external connection 420 provides a connection to the combined drain and source of transistors 480 and 490 and external connection or pin 430 for the drain of the second transistor 430. Other transistor structures manufactured in accordance with the various embodiments disclosed can be used, such as an H-bridge or multiple single transistors. FIG. 4B shows an exemplary plurality of MOSFETs connected to form an H-Bridge that can be coupled with a microcontroller or modulator within a single semiconductor chip 405.

FIG. 5 shows yet another embodiment using two separate semiconductor chips that can be combined within a single housing. A first chip 540 may comprise a microcontroller 510 and may comprise a plurality of bond pads 550. The second chip 500 comprises one or more power MOSFETs 401 which are manufactured according to one of the various embodiments disclosed. Thus, chip 500 may include various bond pads 530 as shown. The two chips 500 and 540 can be interconnected by bond wires 520. Dotted lines indicate that not all connections to the power MOSFET devices 401 need to be connected to the controller chip 540. The resulting device comprises external connections which may be provided by a leadframe as known in the art.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A power metal-oxide-semiconductor field effect transistor (MOSFET) comprising:
    a plurality of transistor cells, each cell comprising a source region and a drain region, the source region and the drain region of each cell disposed to be contacted through a surface of a silicon wafer die;
    a first dielectric layer disposed on the surface of the silicon wafer die;
    a plurality of grooves in said first dielectric layer, each groove formed above the source region or the drain region of a respective cell and filled with a conductive material;
    a second dielectric layer disposed on a surface of the first dielectric layer and comprising openings, wherein each of at least one of the openings exposes a contact area to a respective one of said grooves;
    a metal layer disposed on a surface of said second dielectric layer and filling said openings, wherein the metal layer is patterned and etched to form at least one drain metal wire and at least one source metal wire, wherein the at least one drain metal wire interconnects at least two drain regions of the plurality of transistor cells through respective grooves formed above the at least two drain regions, and the at least one source metal wire interconnects at least two source regions of the plurality of transistor cells through respective grooves formed above the at least two source regions, and wherein each groove has a length extending substantially under an adjacent pair of the at least one drain metal wire and the at least one source metal wire.

2. The power MOSFET according to claim 1, wherein the drain region and the source region are strip shaped.

3. The power MOSFET according to claim 1, wherein each groove covers a substantial surface area of the drain region or the source region.

4. The power MOSFET according to claim 1, wherein each groove is associated with exactly one of the openings in the second dielectric layer.

5. The power MOSFET according to claim 4, wherein the openings in said second dielectric layer are approximately square or round.

6. The power MOSFET according to claim 4, wherein the openings in said second dielectric layer are rectangular.

7. The power MOSFET according to claim 1, wherein no additional metal layer is disposed on top of the metal layer.

8. The power MOSFET according to claim 1, wherein an additional metal layer is disposed on top of the metal layer.

9. A device comprising:
    a housing comprising a microcontroller and at least one power metal-oxide-semiconductor field effect transistor (MOSFET), wherein the power MOSFET comprises a plurality of transistor cells, each cell comprising a source region and a drain region, the source region and the drain region of each cell disposed to be contacted through a surface of a silicon wafer die;
    a first dielectric layer disposed on the surface of the silicon wafer die;
    a plurality of grooves in said first dielectric layer, each groove formed above the source region or the drain region of a respective cell and filled with a conductive material;
    a second dielectric layer disposed on a surface of the first dielectric layer and comprising openings, wherein each of at least one of the openings exposes a contact area to a respective one of said grooves;
    a metal layer disposed on a surface of said second dielectric layer and filling said openings, wherein the metal layer is patterned and etched to form at least one drain metal wire and at least one source metal wire, wherein the at least one drain metal wire interconnects at least two drain regions of the plurality of transistor cells through respective grooves formed above the at least two drain regions, and the at least one source metal wire interconnects at least two source regions of the plurality of transistor cells through respective grooves formed above the at least two source regions, and wherein each groove has a length extending substantially under an adjacent pair of the at least one drain metal wire and the at least one source metal wire.

10. The device according to claim 9, wherein the microcontroller is formed on a first chip and the at least one power transistor is formed on a second chip, wherein the first and second chip are connected within said housing by wire bonding.

11. The device according to claim 9, wherein the microcontroller and the at least one power MOSFET are formed on a single chip.

12. The device according to claim 9, comprising a plurality of power MOSFETs.

13. The device according to claim 9, wherein the drain region and the source region are strip shaped.

14. The device according to claim 9, wherein each groove covers a substantial surface area of the drain region or the source region.

15. The device according to claim 9, wherein each groove is associated with exactly one of the openings in the second dielectric layer.

16. The device according to claim 15, wherein the openings in said second dielectric layer are approximately square or round.

17. The device according to claim 15, wherein the openings in said second dielectric layer are rectangular.

18. The device according to claim 9, wherein no additional metal layer is disposed on top of the metal layer.

* * * * *